United States Patent
Butzmann

(10) Patent No.: US 8,063,635 B2
(45) Date of Patent: Nov. 22, 2011

(54) MAGNETORESISTIVE SENSOR WITH THREE CORNERS WITH TWO WIRING CONNECTIONS

(75) Inventor: Stefan Butzmann, Hamburg (DE)

(73) Assignee: NXP B.V., Eindhoven (NL)

( * ) Notice: Subject to any disclaimer, the term of this patent is extended or adjusted under 35 U.S.C. 154(b) by 343 days.

(21) Appl. No.: 12/446,949

(22) PCT Filed: Oct. 18, 2007

(86) PCT No.: PCT/IB2007/054245
§ 371 (c)(1),
(2), (4) Date: Apr. 30, 2009

(87) PCT Pub. No.: WO2008/050266
PCT Pub. Date: May 2, 2008

(65) Prior Publication Data
US 2009/0284256 A1    Nov. 19, 2009

(30) Foreign Application Priority Data

Oct. 23, 2006 (EP) .................................... 06122726

(51) Int. Cl.
G01R 33/02 (2006.01)
(52) U.S. Cl. ...................................................... 324/252
(58) Field of Classification Search .................. None
See application file for complete search history.

(56) References Cited

U.S. PATENT DOCUMENTS

| 5,880,586 | A  | * | 3/1999  | Dukart et al. ............... 324/207.2 |
| 6,212,783 | B1 | * | 4/2001  | Ott et al. ........................ 33/1 PT |
| 6,433,973 | B1 |   | 8/2002  | Li et al. |
| 6,735,062 | B1 |   | 5/2004  | Pokhil et al. |
| 6,952,325 | B2 | * | 10/2005 | Sato et al. ................. 360/125.08 |

FOREIGN PATENT DOCUMENTS

| DE | 198 39 450 A1      | 3/2000 |
| DE | 10 2004 019 238 A1 | 8/2005 |
| EP | 0 411 971 B1       | 2/1991 |
| JP | 9119966 A          | 5/1997 |

* cited by examiner

Primary Examiner — Paresh Patel

(57) ABSTRACT

The invention relates to a magnetoresistive sensor with a triangle made of magnetic sensitive material with three corners with two wiring connections, wherein the three sides of the triangle have different or at least substantially equal length.

5 Claims, 2 Drawing Sheets

MAGNETORESISTIVE SENSOR WITH THREE CORNERS WITH TWO WIRING CONNECTIONS

FIELD OF THE INVENTION

The invention relates generally to a sensor, especially to a magnetoresistive sensor used for angular detection. Additionally the invention relates to a method of measuring an angle.

Magnetoresistive sensors are extensively used to detect angular positions or angular movements of elements. Such kinds of sensors are currently used in many automotive applications, e. g. for pedal positioning or throttle control.

BACKGROUND OF THE INVENTION

The sensors currently in use make use of Wheatstone bridges, which are rotated against each other by an angle of 45°. If an angle of an external magnetic field is changed, the two bridges deliver different signals with a phase difference of 45°. Thus the angular position can be determined. Such sensors are known from DE 198 39 450 A1.

DE 10 2004 019 238 A1 discloses a device for measuring the direction of a magnetic field especially for use in a magnetoresistive sensor and a method for determining the direction of magnetic fields using voltage dividers, consisting of resistors that are configured from magnetoresistive thin layers, at least three voltage dividers being arranged in such a way that the signal voltages of the different voltage dividers, which occur in the central contacts during the rotation of the magnetic fields, have phases that are offset in relation to one another.

EP 0 411 971 B1 discloses a device using three magnetoresistive sensors arranged as a pyramid.

Disadvantages of the above mentioned types of sensor elements are its relatively high offset and the offset drift over temperature. Therefore the signals are not reproducible. These drawbacks result in the need for a sophisticated offset compensation either by the customer or on the signal conditioning die.

SUMMARY OF THE INVENTION

The aim of this invention is to mitigate the drawbacks of the prior art and to create a sensor, especially a magnetoresistive sensor with low offset, which can be located in the center of rotation of a magnet, e.g. a block magnet.

The invention relates generally to a sensor, especially to a magnetoresistive sensor used for angular detection. Consistent with an example embodiment there is a magnetoresistive sensor with a triangle made of magnetic sensitive material with three corners with two wiring connections. The three sides of the triangle have different or at least substantially equal length. A feature of this embodiment is that the triangle may be made of permalloy. Furthermore, the triangle may be a hollow triangle where the inner part of the triangle is left away; the inner part consists of three side bars of different length or at least substantially equal length. An additional feature may include the corner is connectable to a current source while the other corners are connectable to a current or voltage detection system.

Consistent with another example embodiment, there is a method of measuring an angle of a magnetic field with a magnetoresistive sensor with a triangle made of magnetic sensitive material with three corners with two wiring connections on every corner. The three sides of the triangle have different or at least substantially equal length. A current is supplied to one contact at one corner acting as a source. The other two contacts at two other corners act as a sink and are kept on a reference potential; the current or the voltage on every of the two other corners is measured.

BRIEF DESCRIPTION OF THE DRAWINGS

The above and other features and advantages of the invention will be apparent from the following description of an exemplary embodiment of the invention with reference to the accompanying drawings, in which.

DETAILED DESCRIPTION OF THE DRAWINGS

Figure 1:
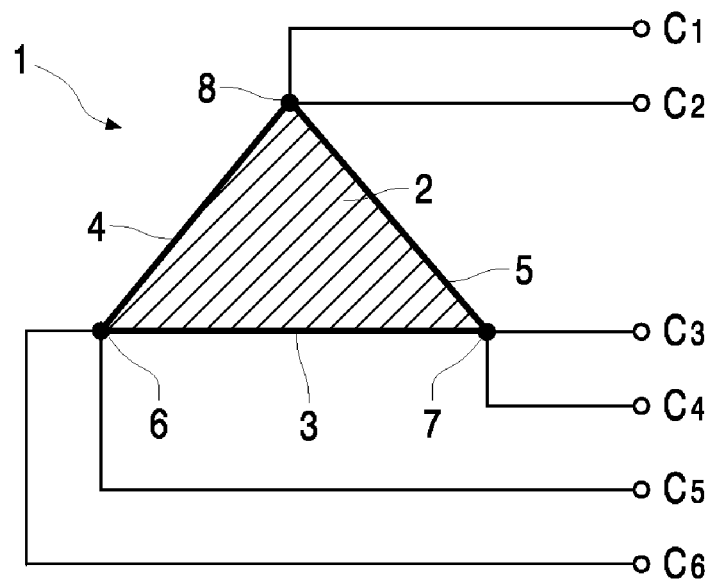
FIG. 1 shows a schematic view of an inventive sensor.

FIG. 1 show in a schematic view the principle layout of the new and inventive angle sensor 1. The structure of the sensor 1 consists of a triangle 2 with sides 3, 4, 5 of different or at least substantially equal length and with two wiring connections $C_1$, $C_2$, $C_3$, $C_4$, $C_5$, $C_6$ at each corner 6, 7, 8 in order to allow a signal conditioning with voltage sensing.

In order to determine the magnetic field angle, a current has to be supplied to one contact acting as a source, while the other two contacts acting as a sink are kept on a reference potential. As the angle of the externally applied magnetic field determines the resistances of the permalloy material of the triangle in different directions, different currents will flow to the two sink contacts. Subtraction of the two currents yields in a signal varying sinusoidally with rotation of the magnetic field. By applying this kind of stimulation alternatingly to all three contacts, three signals can be obtained with a phase offset to each other.

Figure 2:
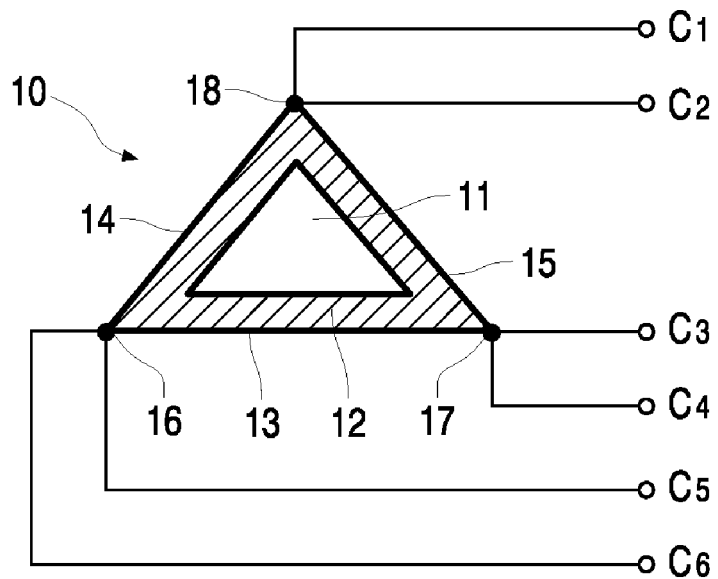
FIG. 2 shows a schematic view of an inventive sensor.

FIG. 2 shows an alternative configuration of the inventive sensor 10, where the inner part 11 of the triangle 12 is left away. This configuration has the advantage, that the resistances of the sides increase thus yielding higher signal levels, however, possibly also at the cost of increased offset. The structure of the sensor 10 consists of a hollow triangle 12 and again with sides 13, 14, 15 of different or at least substantially equal length and with two wiring connections $C_1$, $C_2$, $C_3$, $C_4$, $C_5$ and $C_6$ at each corner 16, 17, 18.

Figure 3:
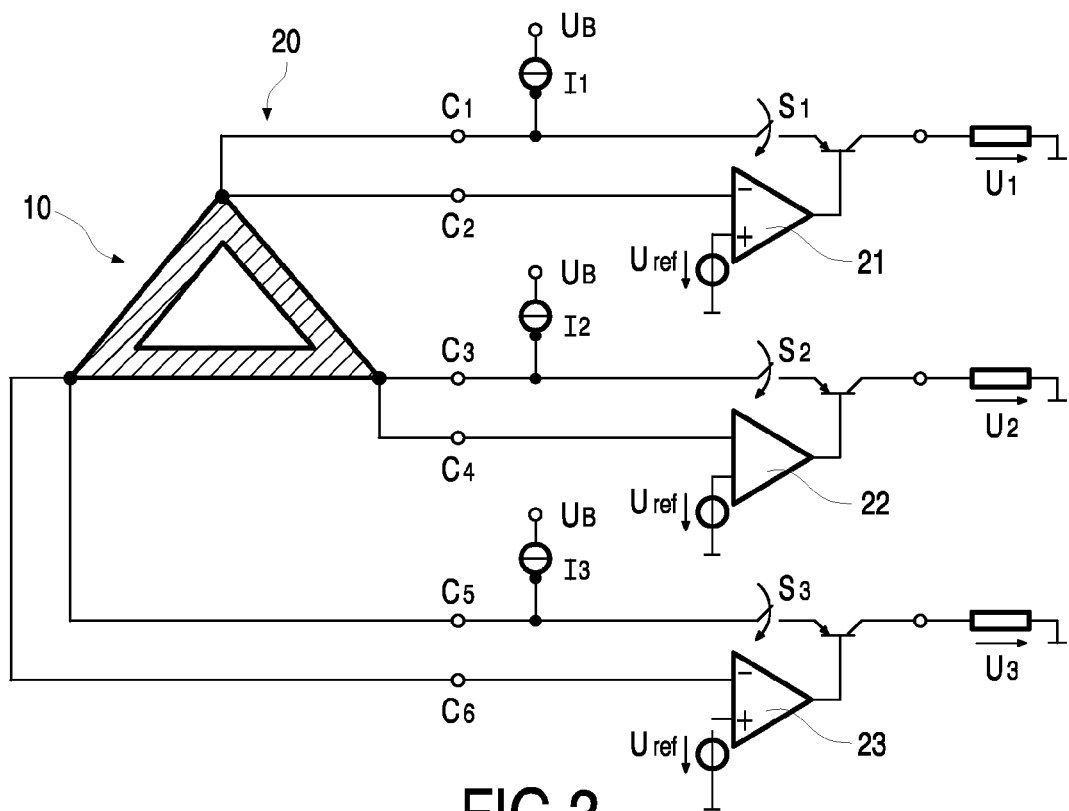
FIG. 3 shows a schematic view of an inventive sensor.

FIG. 3 shows the realization of a possible signal conditioning circuit 20 of the above mentioned sensor 10 according to FIG. 2. In the circuit 20, one of the current sources, e. g. I1, is supplying a current to the triangular structure 10, while the other two current sources I2 and I3 are switched off. At the same time, the switch S1 is open, thus ensuring that the complete current I1 flows to the permalloy structure 10, while the switches S2 and S3 are closed. The operational amplifiers 21, 22, 23 connected to C4 and C6 keep the two remaining corners of the permalloy structure 10 at the potential of Uref. The relation of the currents flowing from C2 to C3 and from C2 to C5 then depends on the direction of the external magnetic field applied. The difference of these currents is proportional to the difference of the resulting voltages U2−U3.

In a similar way, the current source I2 is switched on, I1 and I3 are switched off, the switch S2 is opened, while S1 and S3 are closed and the voltage difference U1−U3 is measured. U1−U2 is obtained similarly, when I3 is turned on and S1 and S2 are closed.

Figure 4:
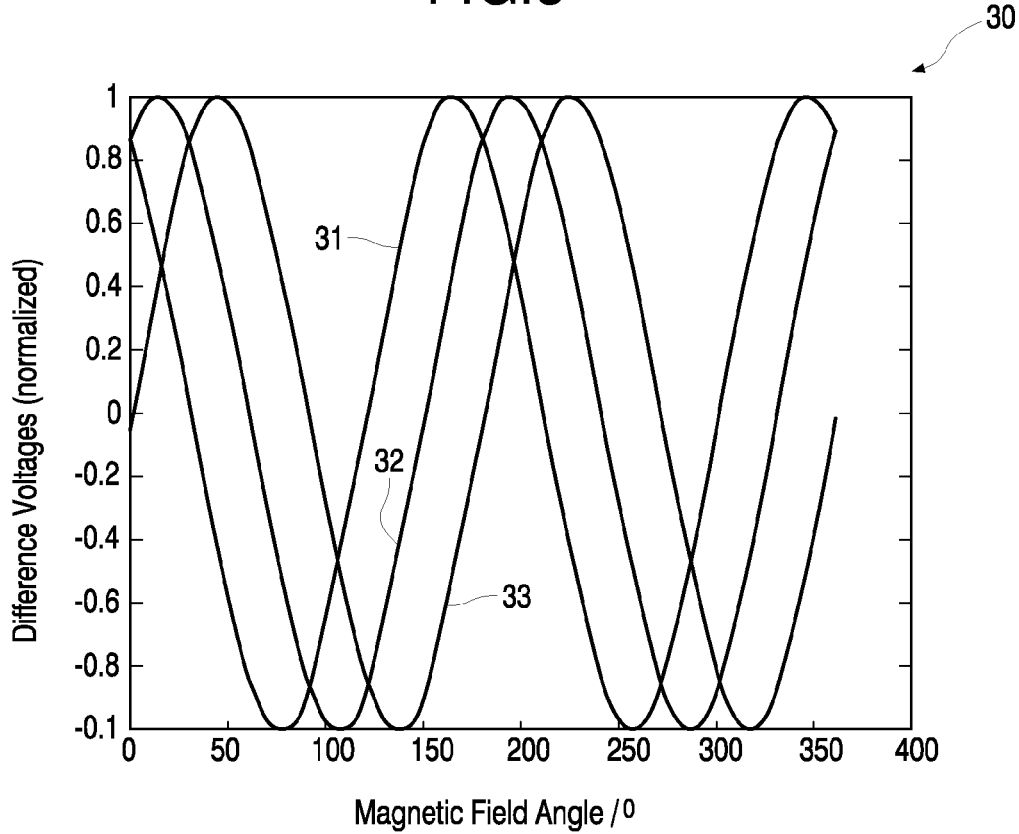
FIG. 4 shows a diagram.

By this way, three signals DU12 (31)=U1−U2, DU13 (32)=U1−U3 and DU23 (33)=U2−U3 are obtained, which are dependent on the direction of the external magnetic field as shown in FIG. 4 with a periodicity of 180°. These three difference signals have a phase offset of 30° magnetic field angle to each other. FIG. 4 shows in a diagram 30 the difference voltages DU12, DU13, DU23 as simulation data. It can be shown by trigonometric equations that the magnetic field angle α a can now be determined from these signals by the following equation:

$$\alpha = \frac{1}{2} \cdot \arctan\left(\sqrt{3}\, \frac{\Delta U_{12}}{\Delta U_{13} + \Delta U_{23}}\right)$$

The sensor allows the determination of the magnetic field angle α with only one permalloy geometry of triangular shape and therefore promises better linearity behaviour than structures with two permalloy areas located next to each other. Additionally, the magnetic field angle can be determined by measuring the current distribution in the permalloy structures yielding in a robuster behaviour against external disturbances.

A sensor as above described may be used in angular sensing applications, such as throttle, pedal or windshield wipers.

REFERENCES 1 sensor
2 triangle
3 side
4 side
5 side
6 corner
7 corner
8 corner
10 sensor
11 inner part
12 triangle
13 side
14 side
15 side
16 corner
17 corner
18 corner
20 circuit
21 operational amplifiers
22 operational amplifiers
23 operational amplifiers
30 diagram
31 signal curve
32 signal curve
33 signal curve

The invention claimed is:

1. Magnetoresistive sensor with a triangle made of magnetic sensitive material with three corners with two wiring connections, wherein the three sides of the triangle have different or at least substantially equal length.

2. Sensor according to claim 1, wherein the triangle is made of permalloy.

3. Sensor according to claim 1, wherein the triangle is a hollow triangle where the inner part of the triangle is left away, consisting of three side bars of different or at least substantially equal length.

4. Sensor according to claim 1, wherein the corner is connectable to a current source while the other corners are connectable to a current or voltage detection system.

5. Method of measuring an angle of a magnetic field with a magnetoresistive sensor with a triangle made of magnetic sensitive material with three corners with two wiring connections on every corner, wherein the three sides of the triangle have different or at least substantially equal length, wherein a current has to be supplied to one contact at one corner acting as a source, while the other two contacts at two other corners acting as a sink are kept on a reference potential and measuring the current or the voltage on every of the two other corners.

* * * * *